United States Patent
Norton

(10) Patent No.: US 10,235,320 B2
(45) Date of Patent: Mar. 19, 2019

(54) CONNECTOR FOR A COMPUTING ASSEMBLY

(71) Applicant: Hewlett Packard Enterprise Development LP, Houston, TX (US)

(72) Inventor: John Norton, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 274 days.

(21) Appl. No.: 14/897,898

(22) PCT Filed: Jul. 30, 2013

(86) PCT No.: PCT/US2013/052773
§ 371 (c)(1),
(2) Date: Dec. 11, 2015

(87) PCT Pub. No.: WO2015/016843
PCT Pub. Date: Feb. 5, 2015

(65) Prior Publication Data
US 2016/0147694 A1 May 26, 2016

(51) Int. Cl.
*G06F 13/40* (2006.01)
*H01L 25/00* (2006.01)
*H05K 1/18* (2006.01)
*G06F 13/36* (2006.01)
*H05K 1/02* (2006.01)

(52) U.S. Cl.
CPC .......... *G06F 13/4027* (2013.01); *G06F 13/36* (2013.01); *G06F 13/409* (2013.01); *G06F 13/4068* (2013.01); *H01L 25/00* (2013.01); *H05K 1/181* (2013.01); *H01L 2924/0002* (2013.01); *H05K 1/0274* (2013.01); *H05K 2201/1053* (2013.01);
(Continued)

(58) Field of Classification Search
None
See application file for complete search history.

(56) References Cited

U.S. PATENT DOCUMENTS 7,148,428 B2   12/2006  Meier et al.
7,975,378 B1    7/2011  Dutta
(Continued)

OTHER PUBLICATIONS

Korean Intellectual Property Office, International Search Report and Written Opinion for PCT/US2013/052773 dated Apr. 28, 2014 (13 pages).
(Continued)

*Primary Examiner* — Henry Tsai
*Assistant Examiner* — Aurangzeb Hassan
(74) *Attorney, Agent, or Firm* — Trop, Pruner & Hu, P.C.

(57) ABSTRACT

Examples disclosed herein provide a computing assembly. The computing assembly includes a first CPU package mounted on a PCB, and a second CPU package mounted on the PCB. The computing assembly includes a connector to bridge a convection between a connection interface of the first CPU package and a connection interface of the second CPU package, wherein the connector comprises a plurality of signal paths for routing signals from the first and second CPU packages. The signals paths include a first signal path to route signals between the first and second CPU packages, and a second signal path to route signals between the first CPU package and another component.

20 Claims, 6 Drawing Sheets

(52) U.S. Cl.
CPC .............. *H05K 2201/10325* (2013.01); *H05K 2201/10356* (2013.01); *Y02P 70/611* (2015.11)

(56) References Cited

U.S. PATENT DOCUMENTS

| | | |
|---|---|---|
| 8,353,708 B2 | 1/2013 | Hsu |
| 2009/0023330 A1 | 1/2009 | Stoner et al. |
| 2009/0089466 A1* | 4/2009 | Cunningham .......... H01L 23/48 710/100 |
| 2010/0078826 A1 | 4/2010 | Gurumurthy et al. |
| 2010/0129999 A1* | 5/2010 | Zingher ................. H01L 23/48 438/611 |
| 2010/0241909 A1* | 9/2010 | Niino ................. G06F 11/1645 714/48 |
| 2011/0041010 A1 | 2/2011 | Mayer |
| 2011/0312129 A1 | 12/2011 | Joseph et al. |
| 2013/0147815 A1 | 6/2013 | Solki et al. |

OTHER PUBLICATIONS

PCIe over Cable for High-Speed I/O, Bus Expansion and Networking, (Web Page), Aug. 2008, 4 Pages.

\* cited by examiner

CONNECTOR FOR A COMPUTING ASSEMBLY

BACKGROUND

Computing devices, such as servers, may utilize multiple components to perform various functions. The components of a computing device may be arranged on a printed circuit board (PCB), such as a motherboard of the computing device. In various examples, chip sockets may be used to couple various ones of these components to the PCB. In other examples, the components may be directly coupled to the PCB. The PCB may mechanically support and electrically connect the components using conductive pathways, tracks, or signal traces etched from a metal, such as copper.

DETAILED DESCRIPTION

With the introduction of multi-processing, computing devices may include multiple central processing unit (CPU) packages. The CPU packages may run multiple instructions at the same time, increasing overall speed for programs running on a computing device. The CPU packages may be coupled to a PCB within the computing device either via a socket or directly soldered to the PCB, for instance. In addition to a CPU package communicating with other CPU packages of the computing device, the CPU package may exchange transmissions with other components of the computing device. As signal speeds in many processor-based systems continue to increase, a challenge faced by manufacturers of computing devices is ensuring the integrity of signals exchanged between the components of the computing device.

Examples disclosed herein provide a connector for bridging high speed connections between components of a computing device. By using the connector in a computing device with multiple CPU packages, the connector may allow for a CPU package to exchange high speed communications directly with the other CPU packages, and for the CPU packages to exchange direct communications with other components of the computing device via the connector. In addition, the connector may allow for the CPU packages to be placed closer to each other on the PCB, which may ensure signal integrity by reducing the length of pathways that a signal travels between the CPU packages.

In one example, a computing assembly can have a first CPU package mounted on and electrically coupled to a PCB, and a second CPU package mounted on and electrically coupled to the PCB. A substantially planar connector can bridge a high speed connection between a connection interface of the first CPU package and a connection interface of the second CPU package, wherein the connector can include a plurality of signal paths for routing high speed signals from the first and second CPU packages. The signal paths include a first signal path to route signals between the first and second CPU packages, and a second signal path to route signals between the first CPU package and another component.

In another example, a computing assembly can have a CPU package mounted on and electrically coupled to a PCB. A connector can bridge a connection between the CPU package and another component, wherein the connector is angled, for instance the connector may form a right angle.

In yet another example, a method includes coupling a connection interface of a first CPU package to a connector, and coupling a connection interface of a second CPU package to the connector, wherein the connector bridges a connection between the first and second CPU packages. The connector may include a first signal path to route signals between the first and second CPU packages, and a second signal path to route signals between the first CPU package and another component. The method may include coupling the first and second CPU packages to a PCB.

Figure 1:
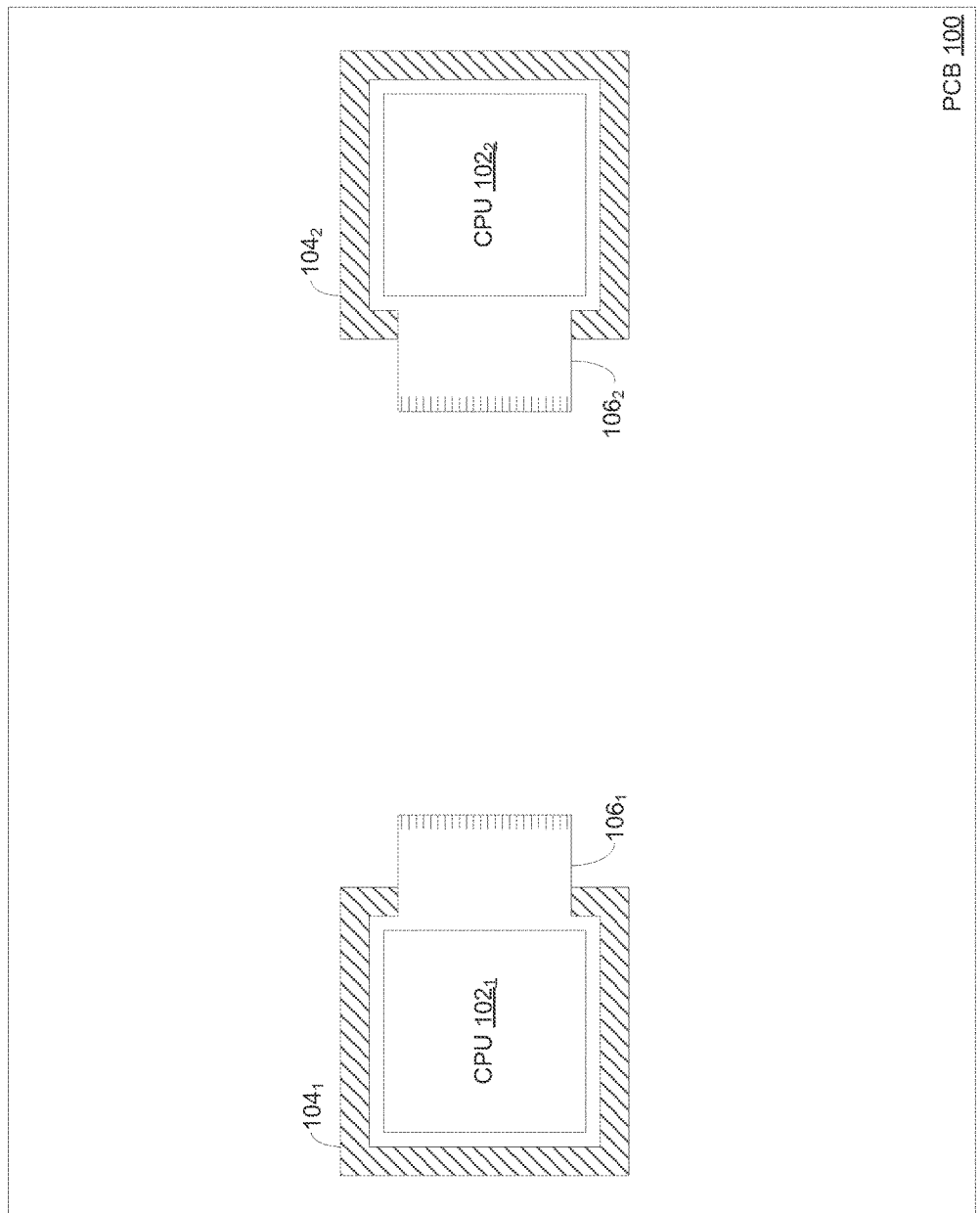
FIG. 1 illustrates multiple processing units of a computing device, according to an example.

With reference to the figures, FIG. 1 illustrates multiple processing units of a computing device, according to an example. As illustrated, CPU packages $102_1$, $102_2$ may be mounted on PCB 100 via sockets $104_1$, $104_2$, respectively. However, one or more of the CPU packages 102 may equally be directly soldered to the PCB without a socket 104 (not shown). Although only two CPU packages are illustrated, the computing device may have any number of CPU packages.

In addition to communicating via the conductive pathways of the PCB 100, the CPU packages 102 may communicate with each other or with other components of the computing device via a connection interface 106 (including $106_1$ and $106_2$ in FIG. 1). The connection interface 106 may be an edge connector that can be plugged into a matching female connector. The CPU package may comprise a card with the connection interface 106, or a substrate of the CPU package 102 may include the connection interface 106, allowing for the CPU package 102 to interact with the rest of the computing device. As illustrated, the connection interface 106 for each CPU package may face each other, but other orientations of the CPU packages are possible. In addition, the sockets 104 may be open on one side to accommodate the connection interfaces 106.

Figure 2A:
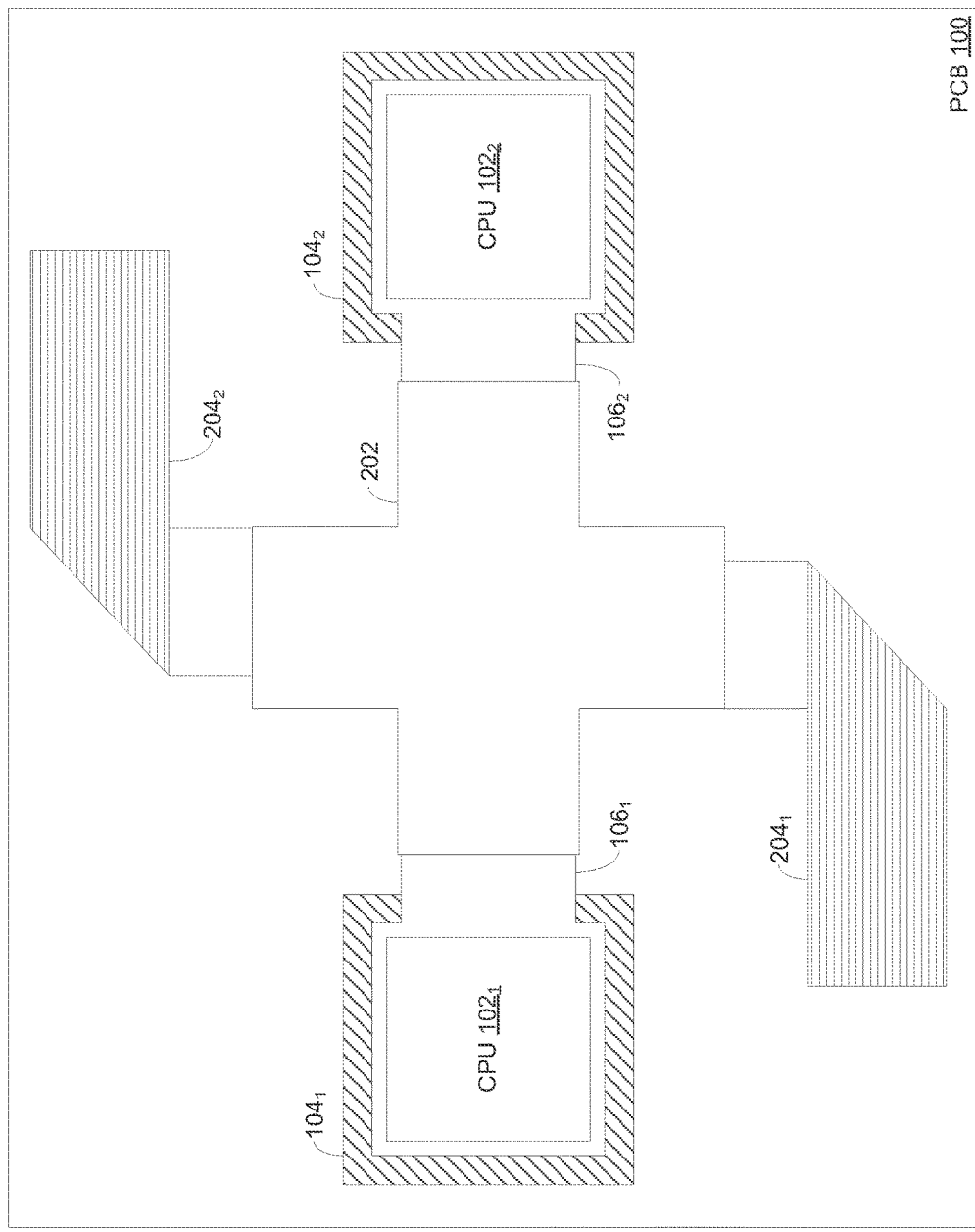
FIGS. 2A-B illustrate a connector for bridging connections between CPU packages and other components of a computing device, according to an example.

FIG. 2A illustrates a connector 202 for bridging connections between the CPU packages 1021, 1022 and other components of a computing device, according to an example. The connector 202 may include a plurality of signal paths for routing signals from the CPU packages 1021, 1022. As an example, the CPU packages 1021, 1022 may communicate with other components of the computing device via cables 204 (including $204_1$ and $204_2$ in FIG. 2A). The connector 202 may include female connectors for accommodating the connection interfaces 106 of the CPU packages and the connection interfaces of the cables 204.

Connector 202 may bridge a connection between CPU package $102_1$ and cable $204_1$ via a first signal path of the connector 202, and a connection between CPU package $102_2$ and cable $204_2$ via a second signal path of the connector 202. As an example, the CPU packages $102_1$, $102_2$ may be coupled to the connector 202 prior to coupling the CPU packages to their respective sockets 104. As a result, the CPU packages $102_1$, $102_2$ and the connector 202 may essentially be one piece as they are mounted on PCB 100.

As illustrated, the connections made by the CPU package 102 to the connector 202 and the cable 204 to the connector 202 may form a right angle or a substantially right angle. By bridging the connection between the CPU package 102 and the cable 204 at an angle to the connection interface 106 of the CPU package, or at a position where the cable 204 is not parallel to the connection interface 106, the CPU packages $102_1$, $102_2$ may be placed close together on the PCB 100. As a result, the lengths of the pathways for signals to travel between the CPU packages $102_1$, $102_2$ via the connector 202 may be reduced.

With the ports of the connector 202 for coupling to the cables 204 facing away from the connection interface 106 of the CPU packages 102, the cables 204 may be easily coupled to the connector 202, irrespective of how close the CPU packages $102_1$, $102_2$ are placed next to each other. Although FIG. 2A illustrates that the connections made by the CPU packages 102 and the cable 204 to the connector 202 form a right angle, other angles may be possible that allow the CPU packages $102_1$, $102_2$ to be placed closer together on the PCB 100.

In addition to reducing the lengths of the pathways for signals to travel between the CPU packages $102_1$, $102_2$, the number of connection points that signals traverse between the CPU packages $102_1$, $102_2$ may affect signal integrity. Referring back FIG. 2A, the connector 202 may bridge the connection between the CPU packages $102_1$, $102_2$ by directly connecting the connection interface $106_1$ of CPU package $102_1$ and connection interface $106_2$ of CPU package $102_9$. By directly connecting the CPU packages $102_1$, $102_2$ via connector 202, the connection points a signal traverses between the CPU packages $102_1$, $102_2$ may include a first connection point for coupling connection interface $106_1$ to the connector 202 and a second connection point for coupling the connector 202 to connection interface $106_2$.

By minimizing the number of connection points between the CPU packages $102_1$, $102_2$, the signal integrity may be maintained, or degradation of signals exchanged between the CPU packages $102_1$, $102_2$ may be reduced. By maintaining signal integrity, signals exchanged between the CPU packages $102_1$, $102_2$ may allow for more data to be exchanged in a given period, since individual signals may be shorter, and not repeated as often.

As an example, the connector 202 may comprise a substantially planar housing made up of a non-conductive material, such as a plastic material. The connector 202 includes one or more nonoverlapping signal paths disposed within the connector 202 for routing signals between the components connected to the connector 202. Moreover, the connector housing 202 can be composed of a top half and a bottom half that may be separable to expose the signal paths. The signal paths may be disposed coplanar with an interior surface of the top and/or bottom halves of the connector 202, and may accommodate signals including, but not limited to, electrical and/or optical signals. For routing electrical signals, the signal paths may generally include pins or plating formed from a conductive metal. Examples of metals for routing electrical signals include, but are not limited to, gold and/or copper. For routing optical signals, the signal paths may generally include optical waveguides made from materials such as glass or polymer.

Figure 2B:
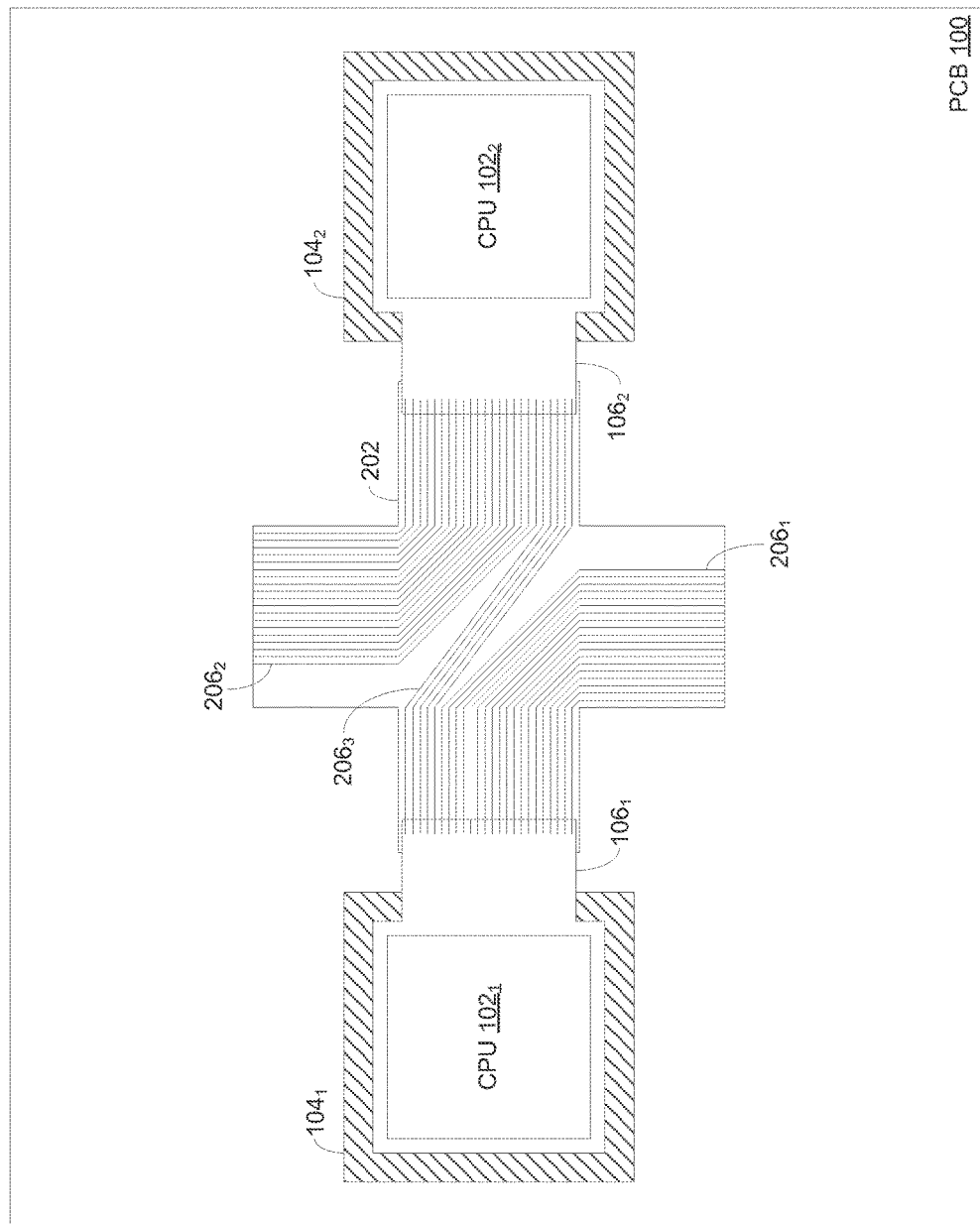

FIG. 2B illustrates the bottom half of the connector 202, exposing multiple nonoverlapping signal paths $206_1$, $206_2$, $206_3$ of the connector 202 for routing signals between various components of the computing device, according to an example. Signal path $206_1$ may route signals from CPU package $102_1$ to a component that is connected to cable $204_1$. Similarly, signal path $206_2$ may route signals from CPU package $102_2$ to a component that is connected to cable $2047$. For transmissions between CPU packages $102_1$, $102_2$, signal path $206_3$ may be used for exchanging signals.

Figure 3A:
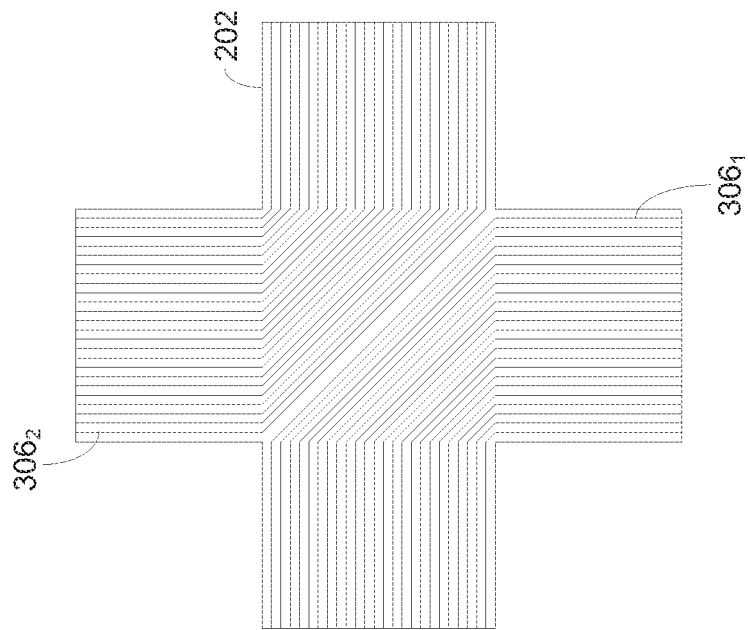
FIGS. 3A-B illustrate various examples of connectors that may be used for connecting a CPU package to other CPU packages and/or non-CPU components.

Referring to FIG. 2B, CPU packages $102_1$, $102_2$ may not have to communicate with each other. As a result, signal path $206_3$ may not be required for exchanging signals between the CPU packages. FIG. 3A illustrates a connector 202 for allowing CPU packages to communicate directly with non-CPU components, according to an example. Signal path $306_1$ may route signals from CPU package $102_1$ to a component that is connected to cable $204_1$. Similarly, signal path $306_2$ may route signals from CPU package $102_9$ to a component that is connected to cable $204_2$.

Figure 3B:
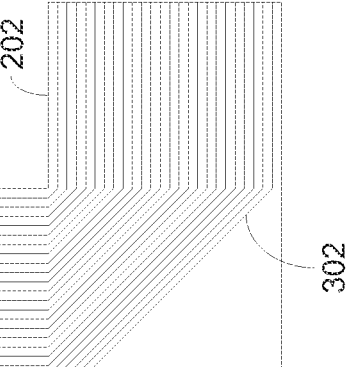

FIG. 3B illustrates a connector 202 for connecting a CPU package directly to another component of the computing device, according to an example. Referring back to FIG. 2A, the only signal path that may be required for the computing device may be between CPU package $102_9$ and the component that is connected to cable $204_2$. As a result, signal path 302 may route signals from CPU package $102_2$ to the component that is connected to cable $204_2$, as illustrated in FIG. 3B. As a result, the connector 202 may bridge the connection between the CPU package $102_2$ and the cable $204_2$, such that the connections made by the CPU package $102_2$ to the connector 202 and the cable $204_2$ to the connector 202 form a right angle.

FIGS. 2B and 3A-B, illustrate various examples of connectors that may be used for connecting a CPU package directly to other CPU packages and/or non-CPU components, but are not limited to those illustrated. For example, the connector may include a various number of signal paths, based on the connections being made. In addition, the connector may not be limited to the cross-shaped patterns previously described.

Figure 4:
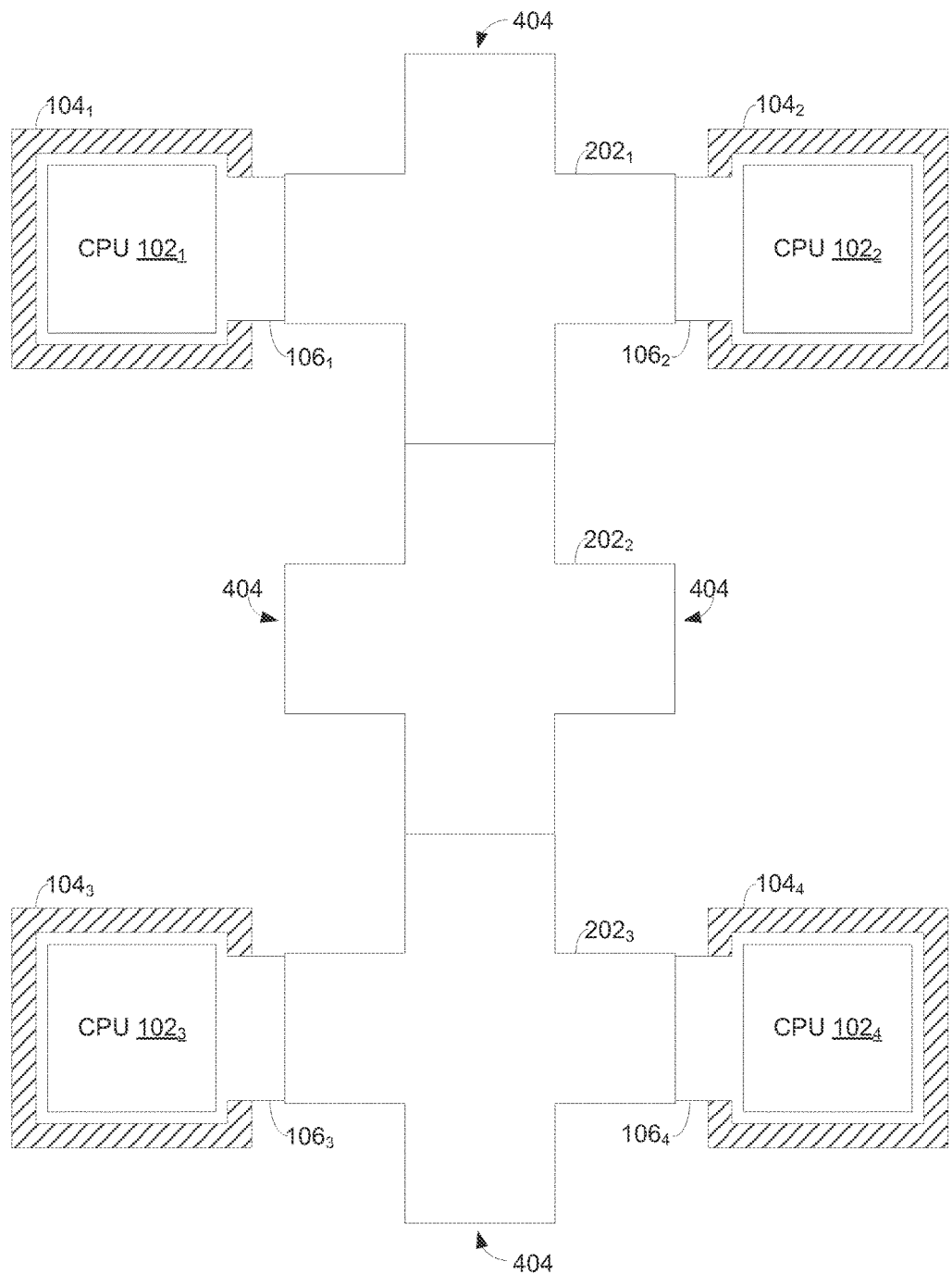
FIG. 4 illustrates a quad-core processor with four CPU packages interconnected via a plurality of connectors, according to an example.

As mentioned above, a computing device may have any number of CPU packages, and not limited to the dual processors as illustrated in the previous figures. However, a number of connectors may be required for bridging the connections between the CPU packages and other components of the computing device. FIG. 4 illustrates a quad-core processor with four CPU packages interconnected via a plurality of connectors $202_1$, $202_2$, $202_3$, according to an example. Although it is illustrated that each connector may be separate and unique, connectors $202_1$, $202_2$, $202_3$ may also form a single connector. As an example, the connectors may be connected to each other by cables (not shown).

It may not be required for all four CPU packages to communicate directly with each other. As a result, each connector $202_1$, $202_2$, $202_3$ may have different signal paths, based on the connections being made. For example, if it is not necessary for CPU packages $102_1$ to communicate with CPU packages $102_2$, then connector $202_1$ may have signal paths similar to the signal paths illustrated in FIG. 3A. As another example, if CPU packages $102_3$ needs to communicate with CPU packages $102_4$, then connector $202_3$ may have signal paths similar to the signal paths illustrated in FIG. 2B. The remaining connection points 404 of the connectors may allow for the CPU packages to communicate with other components of the computing device either directly or via cables, as previously described.

Figure 5:
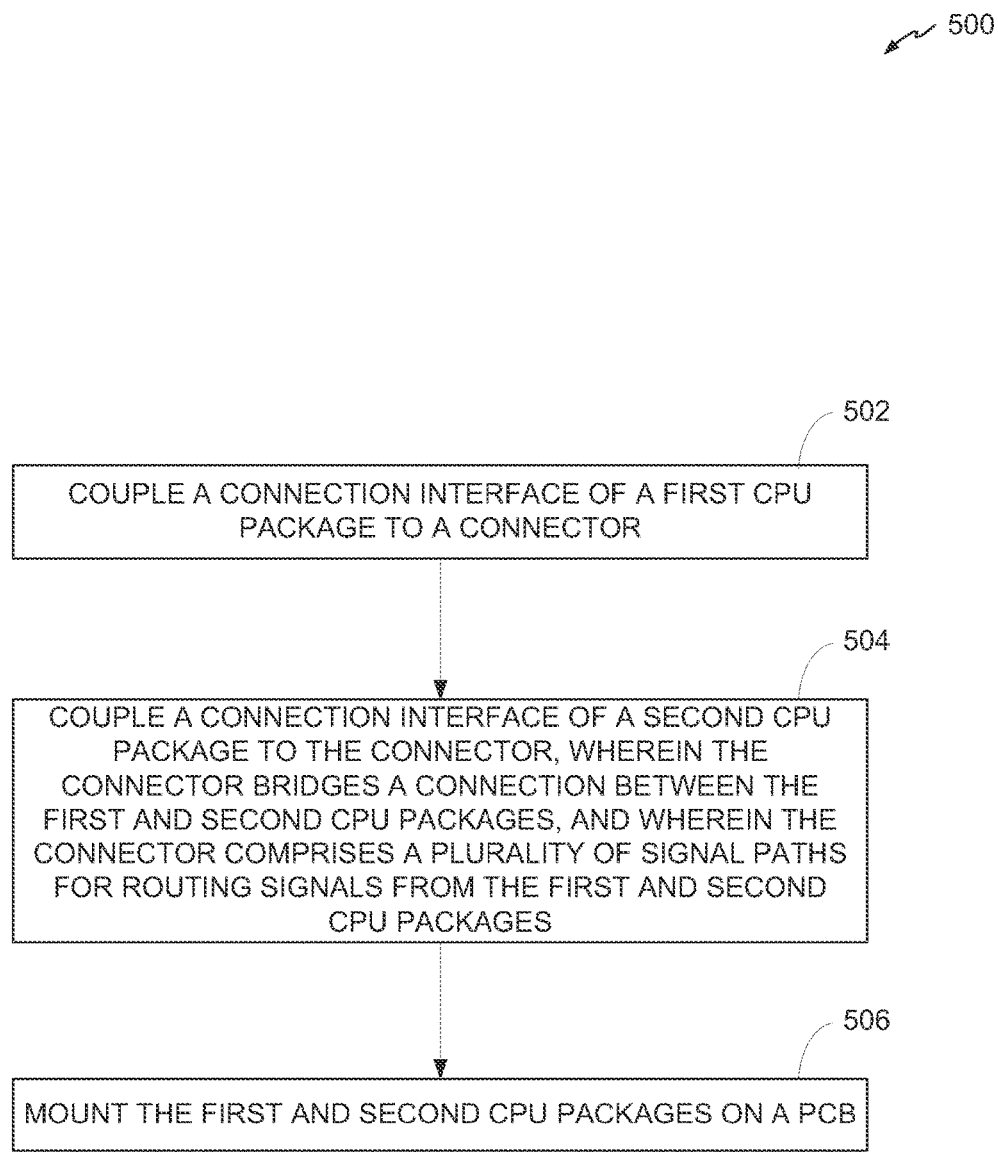
FIG. 5 is a flow diagram in accordance with an example of the present disclosure.

Referring to FIG. 5, a flow diagram is illustrated in accordance with various examples. The flow diagram illustrates processes in a particular order. The order of the processes is not meant to limit the disclosure. Rather, it is expressly intended that one or more of the processes may occur in other orders or simultaneously. The disclosure is not to be limited to any particular example. A method 500 may begin and progress to 502, where a connection interface of a CPU package is coupled to a connector.

Progressing to 504, a connection interface of a second CPU package is coupled to the connector, wherein a connector may bridge a connection between the first and second CPU packages. The connector includes a plurality of signal paths for routing signals from the first and second CPU packages. For example, the connector includes a first signal path to route signals between the first and second CPU packages, and a second signal path to route signals between the first CPU package and another component. Finally, at 506, the first and second CPU packages are mounted on and electrically coupled to a PCB.

It is appreciated that examples described may include various components and features. It is also appreciated that, in the description, numerous specific details are set forth to provide a thorough understanding of the examples. However, it is appreciated that the examples may be practiced without limitations to these specific details. In other instances, well known methods and structures may not be described in detail to avoid unnecessarily obscuring the description of the examples. Also, the examples may be used in combination with each other.

Reference in the specification to "an example" or similar language means that a particular feature, structure, or characteristic described in connection with the example is included in at least one example, but not necessarily in other examples.

The various instances of the phrase "in one example" or similar phrases in various places in the specification are not necessarily all referring to the same example.

It is appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

What is claimed is:

1. A computing assembly, comprising:
    a printed circuit board (PCB);
    a first central processing unit (CPU) package mounted on the PCB;
    a second CPU package mounted on the PCB; and
    a connector to bridge a connection between a connection interface of the first CPU package and a connection interface of the second CPU package, wherein the connector comprises a plurality of signal paths for routing signals from the first and second CPU packages, and wherein the plurality of signals paths comprise:
        a first signal path to route signals between the first and second CPU packages, the first signal path comprising a first signal path portion that extends along a first direction, and a second signal path portion that is diagonal to the first signal path portion; and
        a second signal path to route signals between the first CPU package and another component, the second signal path comprising a third signal path portion that extends along a second direction perpendicular to the first direction, and a fourth signal path portion that is diagonal to the third signal path portion.

2. The computing assembly of claim 1, wherein the plurality of signal paths of the connector to route electrical signals comprise pins or plating formed from a conductive metal.

3. The computing assembly of claim 1, wherein the plurality of signal paths of the connector to route optical signals comprise optical waveguides.

4. The computing assembly of claim 1, wherein the other component is coupled to the connector via a cable.

5. The computing assembly of claim 4, wherein connections made by the first CPU package to the connector and the cable to the connector form a substantially right angle.

6. The computing assembly of claim 1, wherein the connector comprises a substantially planar housing and the plurality of signal paths are nonoverlapping.

7. A connector assembly, comprising:
    a connector housing comprising a first signal path to interconnect connection interfaces of first and second central processing unit (CPU) packages mounted on and electrically coupled to a printed circuit board (PCB),
    the connector housing further comprising a second signal path to interconnect the connection interface of the first CPU package and another component,
    wherein the first signal path comprises a first signal path portion that extends along a first direction, and a second signal path portion that is diagonal to the first signal path portion, and
    wherein the second signal path comprising a third signal path portion that extends along a second direction perpendicular to the first direction, and a fourth signal path portion that is diagonal to the third signal path portion.

8. The connector assembly of claim 7, wherein the plurality of signal paths of the connector housing to route electrical signals comprise pins or plating formed from a conductive metal.

9. The connector assembly of claim 7, wherein the plurality of signal paths of the connector housing to route optical signals comprise optical waveguides.

10. A method, comprising:
    coupling a connection interface of a first central processing unit (CPU) package to a connector;
    coupling a connection interface of a second CPU package to the connector, wherein the connector bridges a connection between the first and second CPU packages, and wherein the connector comprises:
        a first signal path to route signals between the first and second CPU packages, the first signal path comprising a first signal path portion that extends along a first direction, and a second signal path portion that is diagonal to the first signal path portion; and
        a second signal path to route signals between the first CPU package and another component, the second signal path comprising a third signal path portion that extends along a second direction perpendicular to the first direction, and a fourth signal path portion that is diagonal to the third signal path portion; and
    mounting the first and second CPU packages on a printed circuit board (PCB).

11. The method of claim 10, wherein the first signal path comprises optical waveguides.

12. The method of claim 10, wherein mounting the first CPU package on the PCB comprises:
    coupling a CPU socket to the PCB; and
    assembling the first CPU package on the CPU socket.

13. The computing assembly of claim 1, wherein the first, second, third, and fourth signal path portions extend in a plane and do not overlap.

14. The computing assembly of claim 1, wherein the connection interface of the first CPU package comprises a first edge connector, and the connection interface of the second CPU package comprises a second edge connector, and wherein the connector plugs to the first and second edge connectors.

15. The computing assembly of claim 14, wherein the PCB comprises a first socket in which the first CPU package is mounted, and a second socket in which the second CPU package is mounted, wherein the first socket is open on one side to accommodate the first edge connector, and the second socket is open on one side to accommodate the second edge connector.

16. The computing assembly of claim 1, wherein the PCB comprises signal traces over which the first and second CPU packages are able to communicate with one another, and the first signal path is in addition to a signal path comprising the signal traces of the PCB between the first and second CPU packages.

17. The computing assembly of claim 1, wherein the second signal path further comprises a fifth signal path portion that is parallel to the first direction.

18. The connector assembly of claim 7, wherein the first, second, third, and fourth signal path portions extend in a plane in the connector housing and do not overlap.

19. The method of claim 12, wherein the CPU socket is open on one side to accommodate the connection interface of the first CPU package, and the connector is plugged into the connection interface of the first CPU package.

20. The method of claim 19, wherein the connection interface of the first CPU package comprises an edge connector that is accommodated in the open side of the CPU socket.

* * * * *